United States Patent
Deng et al.

(10) Patent No.: US 8,233,341 B2
(45) Date of Patent: *Jul. 31, 2012

(54) METHOD AND STRUCTURE FOR SRAM CELL TRIP VOLTAGE MEASUREMENT

(75) Inventors: Xiaowei Deng, Plano, TX (US); Wah Kit Loh, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/584,220

(22) Filed: Sep. 1, 2009

(65) Prior Publication Data
US 2011/0051540 A1    Mar. 3, 2011

(51) Int. Cl.
*G11C 29/50* (2006.01)
(52) U.S. Cl. .......................... 365/201; 365/205
(58) Field of Classification Search .................. 365/201, 365/205
See application file for complete search history.

(56) References Cited

U.S. PATENT DOCUMENTS

| | | | | |
|---|---|---|---|---|
| 5,325,054 A | * | 6/1994 | Houston | 324/762.01 |
| 6,104,045 A | * | 8/2000 | Forbes et al. | 257/141 |
| 6,128,216 A | * | 10/2000 | Noble et al. | 365/154 |
| 6,172,907 B1 | * | 1/2001 | Jenne | 365/185.18 |
| 7,164,596 B1 | * | 1/2007 | Deng et al. | 365/154 |
| 7,656,698 B1 | * | 2/2010 | Poplevine et al. | 365/154 |
| 2006/0152964 A1 | * | 7/2006 | Ramaraju et al. | 365/154 |

OTHER PUBLICATIONS

Deng et al., "Method and Structure for SRAM Vmin/Vmax Measurement," U.S. NonProvisional Patent Application filed Sep. 1, 2009; U.S. Appl. No. 12/584,219. Texas Instruments Incorporated.

* cited by examiner

*Primary Examiner* — Michael Tran
(74) *Attorney, Agent, or Firm* — Rose Alyssa Keagy; Wade J. Brady, III; Frederick J. Telecky, Jr

(57) ABSTRACT

A parametric test circuit is disclosed (FIG. 6). The test circuit includes a latch circuit having true and complementary terminals. A first access transistor (206) has a current path connected between the true terminal and a first access terminal (214) and has a first control terminal. A second access transistor (208) has a current path connected between the complementary terminal and a second access terminal (216) and has a second control terminal connected to the first control terminal. A first pass gate (604) has a current path connected between the first access terminal (214) and a third access terminal (XBLT) and has a third control terminal. A second pass gate (606) has a current path connected between the second access terminal (216) and a fourth access terminal (XBLB) and has a fourth control terminal connected to the third control terminal.

27 Claims, 5 Drawing Sheets

METHOD AND STRUCTURE FOR SRAM CELL TRIP VOLTAGE MEASUREMENT

Cross-reference is made to commonly assigned patent application Ser. No. 12/584,219 (TI-64160) entitled "METHOD AND STRUCTURE FOR SRAM VMIN/VMAX MEASUREMENT" filed Sep. 1, 2009, the teachings of which are incorporated herein by reference in their entirety.

BACKGROUND OF THE INVENTION

Embodiments of the present invention relate to an improved method and circuit for measuring a trip voltage (Vtrip) of a static random access memory (SRAM) cell of a semiconductor integrated circuit.

Shrinking semiconductor integrated circuit feature sizes have placed increasing challenges on semiconductor integrated circuit testing. In particular, semiconductor integrated memory circuits require complex production testers to determine memory pattern sensitivity at various voltages and temperatures. In addition, parametric test systems are frequently employed in a production environment to determine various operating parameters of individual memory cells. Present sub-micron feature sizes and reduced operating voltages require precise determination of memory cell operating parameters such as trip voltage (Vtrip), minimum and maximum operating voltages, static noise margin, data retention, and others. Second order effects that might have been ignored a decade ago are now critical to reliable and cost-effective circuit operation as will be explained in detail.

FIG. 1 is a block diagram of a parametric test system 100 of the prior art. The parametric test system includes several programmable source measure units (SMUs) 102 and a suitable receptacle or socket 104 for a device under test (DUT). Each source measure unit is arranged to either force voltage and measure current or force current and measure voltage. The DUT may be a production memory circuit operating in a design for test mode or a test circuit for measuring a specific parameter.

Turning now to FIG. 2A, there is a six transistor (6-T) static random access memory (SRAM) cell of the prior art. The 6-T cell includes P-channel drive transistors 202 and 204 and N-channel drive transistors 210 and 212. The drive transistors are connected in a cross coupled manner between true storage node (SNT) 230 and complementary storage node (SNB) 232 as shown to form a latch. N-channel access transistors 206 and 208 couple the latch to true bit line (BLT) 214 and complementary bit line (BLB) 216, respectively, in response to a high level of word line (WL) 200 for read and write operations. Alternatively, a low level of word line 200 turns off access transistors 206 and 208 to isolate the memory cell from BLT 214 and BLB 216 and store a data state. As shown, the data state of the memory cell is a true one when the SNT node stores a '1' and the SNB node stores a '0'. In this state, transistors 202 and 212 are on and transistors 204 and 210 are off. By convention, the true bit line current (IBLT) and the complementary bit line current (IBLB) are defined as positive current from the respective bit line into the memory cell.

Referring now to FIG. 2B, there is a timing diagram of a memory cell trip voltage (Vtrip) test of the prior art. Voltage supplies VDD and VSS are held at high and low levels, respectively, throughout the test. A true one (FIG. 2A) is initially written into the memory cell. Word line voltage (VWL) and BLB voltage (VBLB) are held at a high level. BLT voltage is incrementally stepped to successively lower voltages 220-224 and IBLB is monitored. IBLB is initially high due to current flow through N-channel transistors 208 and 212. At a sufficiently low voltage (Vtrip), however, the memory cell changes state so that transistors 204 and 210 are on and transistors 202 and 212 are off. When transistor 212 is off, current flow through series-connected transistors 208 and 212 abruptly drops to zero as shown at 226. This abrupt drop in current IBLB identifies Vtrip as the voltage following VBLT step 224. Accuracy of this measurement depends on resolution of the VBLT steps as well as the test equipment. The present inventors have identified a need for improvement as will be discussed in detail.

BRIEF SUMMARY OF THE INVENTION

In a preferred embodiment of the present invention, a parametric test circuit for a semiconductor memory is disclosed. The circuit includes a latch circuit having true and complementary terminals. A first access transistor has a current path connected between the true terminal and a first access terminal and having a first control terminal. A second access transistor has a current path connected between the complementary terminal and a second access terminal and has a second control terminal connected to the first control terminal. A first pass gate has a current path connected between the first access terminal and a third access terminal and has a third control terminal. A second pass gate has a current path connected between the second access terminal and a fourth access terminal and has a fourth control terminal connected to the third control terminal.

DETAILED DESCRIPTION OF THE INVENTION

The preferred embodiments of the present invention provide significant advantages in accuracy of the memory cell trip voltage (Vtrip) parametric test as will become evident from the following detailed description.

Figure 1:
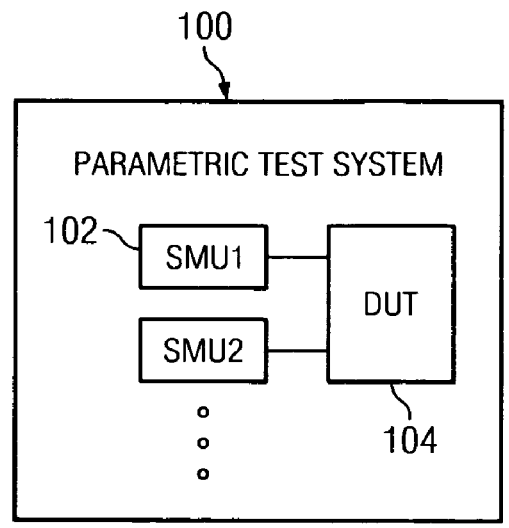
FIG. 1 is a block diagram of a parametric test system of the prior art.
Figure 2A:
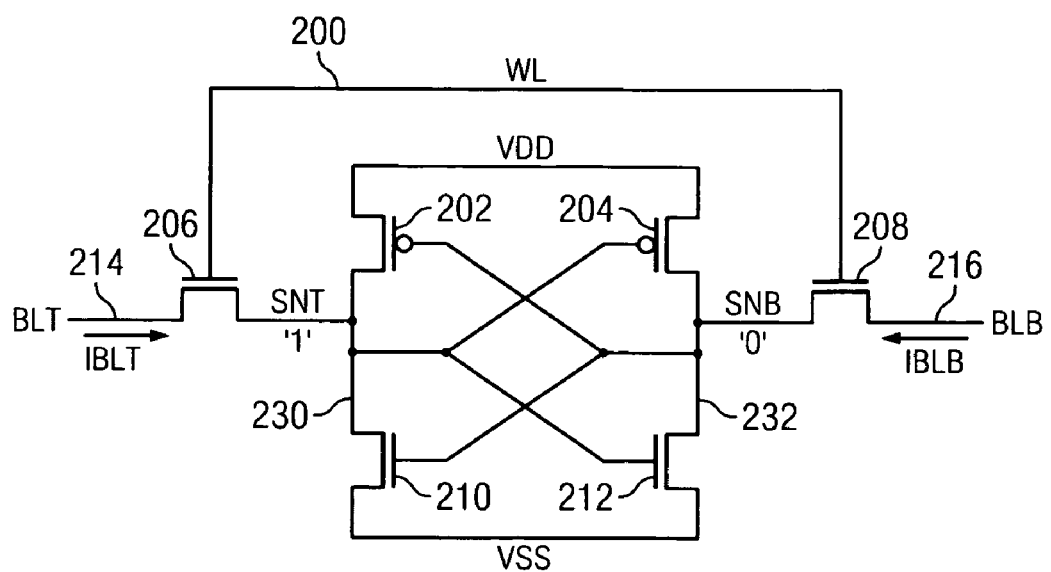
FIG. 2A is a six transistor (6-T) static random access memory (SRAM) cell of the prior art.
Figure 2B:
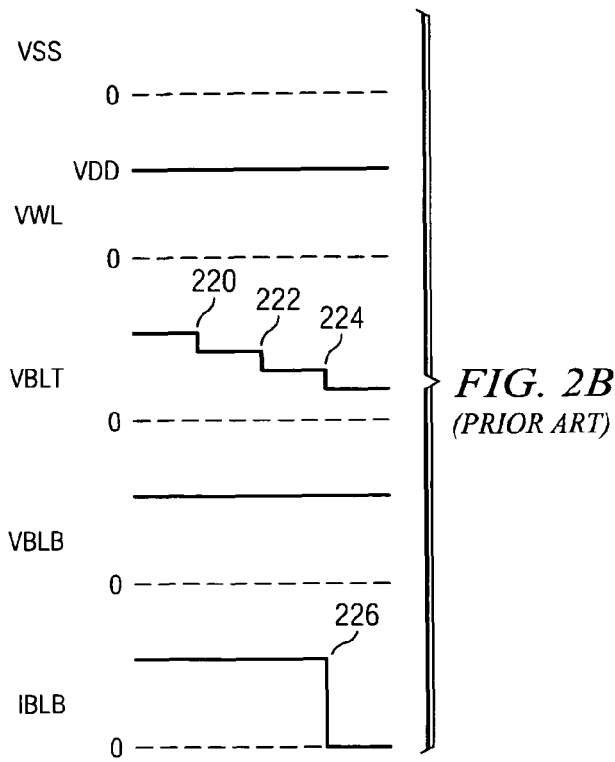
FIG. 2B is a timing diagram of a memory cell trip voltage (Vtrip) parametric test.
Figure 3:
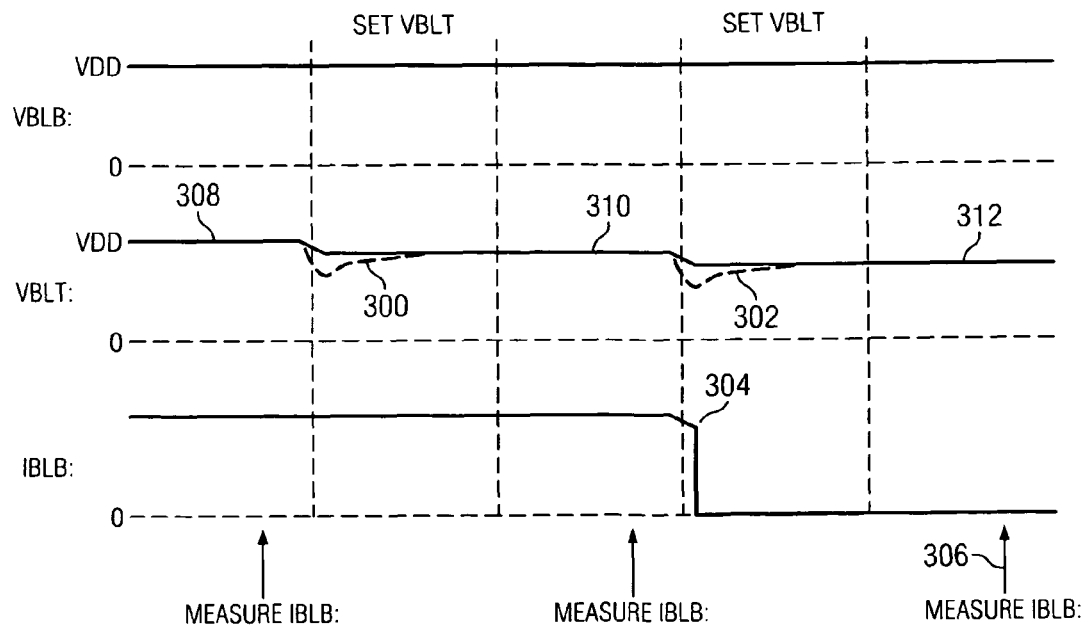
FIG. 3 is a timing diagram showing overshoot of VBLT during voltage steps.

The present inventors have determined that parasitic elements of a parametric test system may produce unexpected and inaccurate results. Referring to FIG. 3, there is a timing diagram showing exemplary waveforms produced by such a production test system performing a Vtrip test. Here, solid lines indicate expected waveforms. Dashed lines (300, 302) indicate overshoot waveforms observed with an oscilloscope during the test. Recall from a previous discussion of the Vtrip test that the memory cell is initialized to a true '1', VBLB is set high, and VBLT is incrementally reduced. IBLB is measured after each reduction of VBLT as indicated. At a first value of VBLT 308, IBLB remains high. When VBLT is reduced, the overshoot 300 may be as much as 200 mV below the intended value of VBLT 310. A second measurement of IBLB, however, does not reveal a change of data state in the memory cell. VBLT is reduced a second time with a corresponding overshoot of 200 mV below the intended value of VBLT 312. This overshoot 302 is sufficient to induce a data state change of the memory cell as indicated by an abrupt drop in IBLB at 304. IBLB is subsequently measured at 306, and Vtrip is incorrectly determined to be the value of VBLT at 312.

Figure 4:
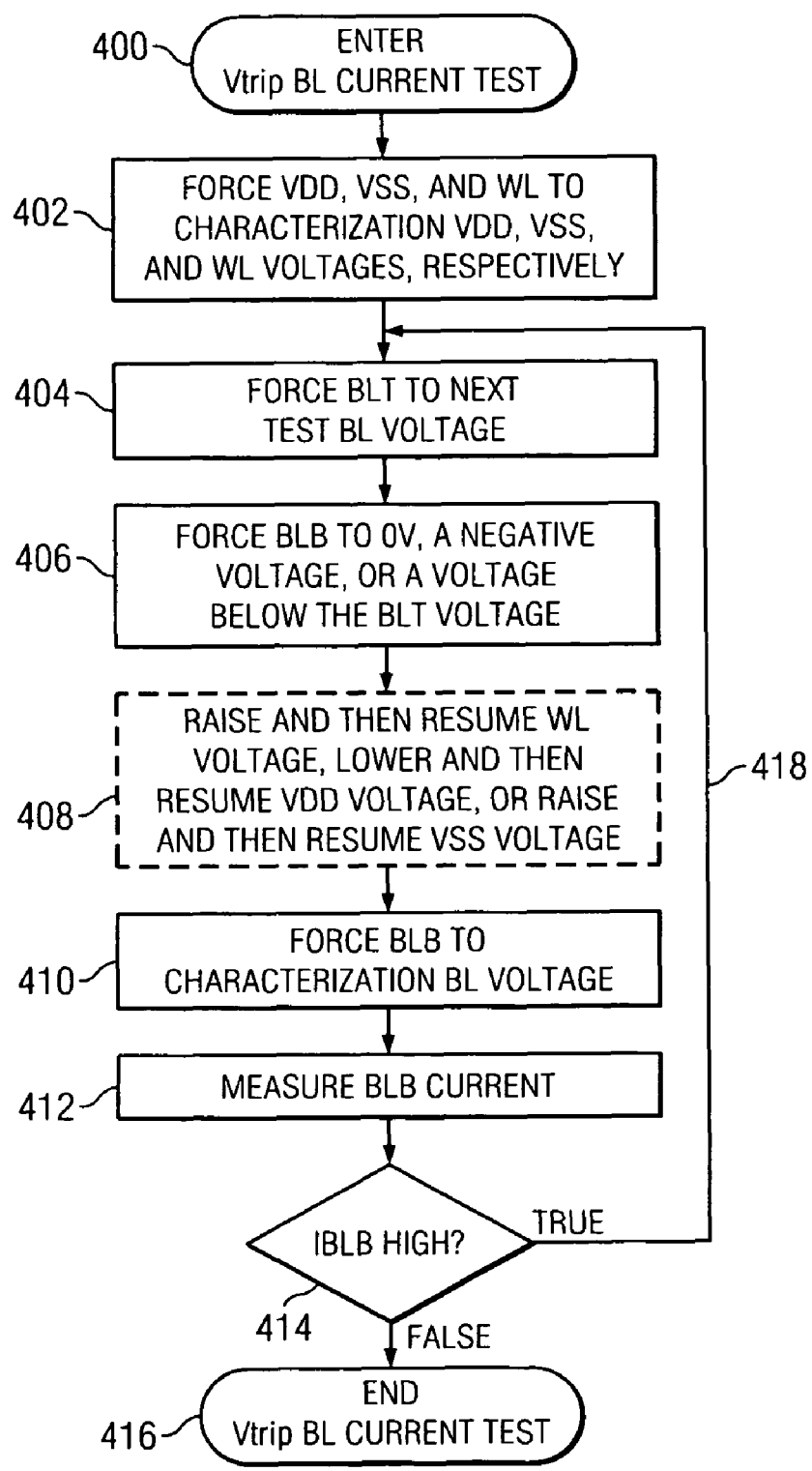
FIG. 4 is a flow chart showing an improved test method of the present invention.

Referring now to FIG. 4, there is a flow chart illustrating an improved test method of the present invention. The flow chart will be discussed with reference to the exemplary waveforms of FIG. 5. The improved Vtrip BL current test begins at step 400. At step 402, VDD, VSS, and the word line (WL) are set to their respective characterization voltages. For example, they may be set to 1.2 V, 0 V, and 1.2 V, respectively.

At step 404 and time T1, VBLT is set to a test bit line (BL) voltage. A corresponding overshoot 500 is indicated by the dashed line. This and subsequent test BL voltages may be selected by incrementing or decrementing the previous test BL voltage. Alternatively, test BL voltages may be selected by an interval halving technique by selecting initial upper and lower test BL voltages that are above and below Vtrip, respectively. Then an intermediate test BL voltage is selected to determine if Vtrip is above or below the intermediate value. Then a new intermediate test BL voltage is selected and the process is repeated until Vtrip is determined.

Figure 5:
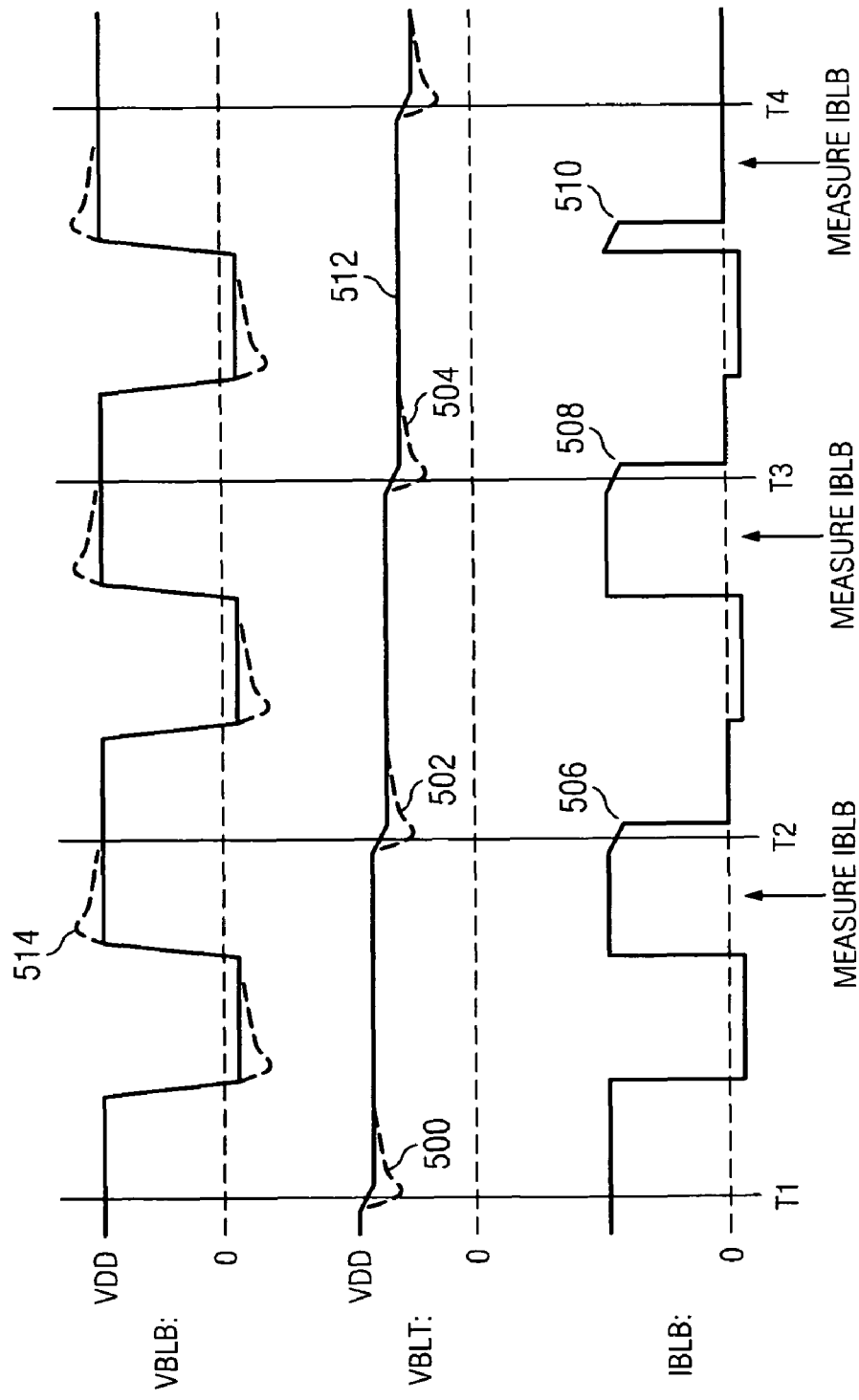
FIG. 5 is a timing diagram of a memory cell trip voltage (Vtrip) parametric test using the method of FIG. 4.

At step 406, VBLB is set to a sufficiently low level to assure that the memory cell under test stores a true 1. This low level may be 0 V or even slightly negative with respect to VSS as shown at FIG. 5. Step 408 is optional as indicated by the dashed line. At step 408 the word line voltage or supply voltage VSS may be increased to facilitate writing a true '1' into the memory cell. Additionally, supply voltage VDD may be decreased to facilitate writing a true '1' into the memory cell. The word line or supply voltages are then restored to their respective initial values. At step 410, VBLB is increased to a high level, which is a characterization BL voltage close to the characterization WL voltage, with a corresponding overshoot 514. The overshoot 514 does not influence the data state of the memory cell, since the access transistor 208 isolates VBLB from the memory cell latch when VBLB is close or above VWL. Next, at step 412 IBLB is measured. Since IBLB is still high in terms of pre-determined high or low value ranges of current at step 414, control is returned to step 404 along path 418.

At step 404 and time T2, VBLT is set to a new test BL voltage which is slightly less than the previous test BL voltage. This time the corresponding overshoot 502, indicated by the dashed line, is sufficient to reverse the data state of the memory cell. The resulting true '0' turns off drive transistor 212, and IBLB drops abruptly to zero 506. At step 406, VBLB is again set to a sufficiently low level to restore a true 1 to the memory cell. At step 410, VBLB is increased to the previous high level. At step 412 IBLB is again measured prior to time T3. IBLB remains at the previous high level, since the temporary data state upset was due to overshoot 502 rather than the intended VBLT level. Since IBLB is still high at step 414, therefore, control is again returned to step 404 along path 418.

At step 404 and time T3, VBLT is set to a new test BL voltage which is slightly less than the previous test BL voltage. The corresponding overshoot 504, indicated by the dashed line, again reverses the data state of the memory cell. The resulting true '0' turns off drive transistor 212, and IBLB drops abruptly to zero 508. At step 406, VBLB is again set to a sufficiently low level to restore a true 1 to the memory cell, and IBLB returns to the previous high level. At step 410, VBLB is increased to the previous high level. Here, however, the intended value of VBLT 512 is sufficiently low to again reverse the memory cell data state to true '0'. Thus, IBLB becomes close to zero 510. At step 412 IBLB is again measured prior to time T4. This time IBLB remains low, and Vtrip is determined to be the level of VBLT 512. Since IBLB is low at step 414, therefore, the Vtrip bit line (BL) current test is terminated at step 416.

Figure 6A:
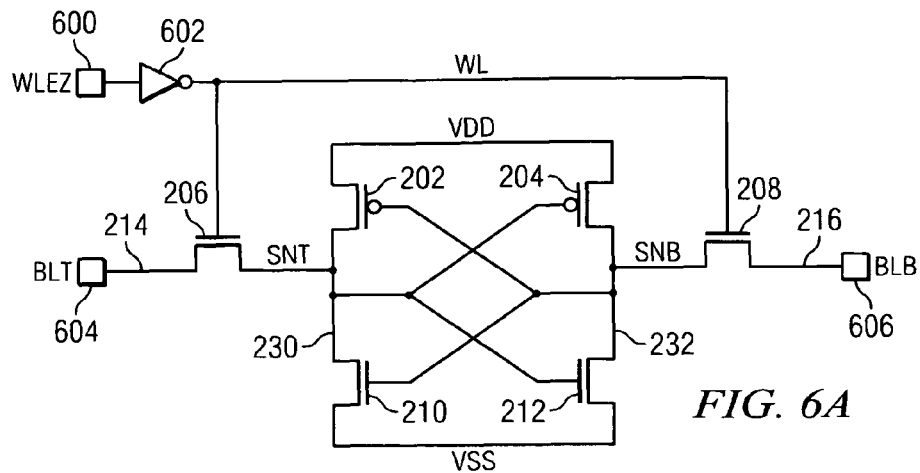
FIG. 6A is a first embodiment of a parametric test circuit of the present invention to improve the memory cell trip voltage (Vtrip) parametric test.

Referring now to FIG. 6A, there is a first embodiment of an improved parametric test circuit of the present invention. The circuit includes P-channel drive transistors 202 and 204 and N-channel drive transistors 210 and 212. The drive transistors are connected in a cross coupled manner as shown to form a latch. A first access transistor 206 has a current path connected between a true terminal (SNT) 230 of the latch and a first access terminal (BLT) 214 and has a first control terminal. The first access terminal 214 is connected to test pad 604. A second access transistor 208 has a current path connected between a complementary terminal (SNB) 232 of the latch and a second access terminal (BLB) 216 and has a second control terminal connected to the first control terminal. The second access terminal 216 is connected to test pad 606. The first (BLT) and second (BLB) access terminals are arranged so that they may be independently controlled. Thus, one access terminal may be held high while the other access terminal is incrementally changed. A logic circuit 602, which is an inverter in this case, has an output terminal (WL) coupled to the first and second control terminals and has an input terminal at test pad 600 coupled to receive an active low enable signal (WLEZ). Alternatively, the logic circuit may comprise other logic gates such as NAND, NOR, or other suitable logic gates.

In operation, the circuit operates as previously described with respect to FIGS. 4 and 5 with the following exceptions. First, steps 406 and 410 (FIG. 4) are omitted. Second, the enable signal (WLEZ) goes high prior to each transition of VBLT (e.g. T1-T3). The enable signal returns low after each overshoot (e.g. 500-504) and the value of VBLT has settled to the intended value. Thus, both access transistors are disabled during the VBLT transition, and the overshoot does not affect the data state stored in the latch circuit of the memory cell.

Figure 6B:
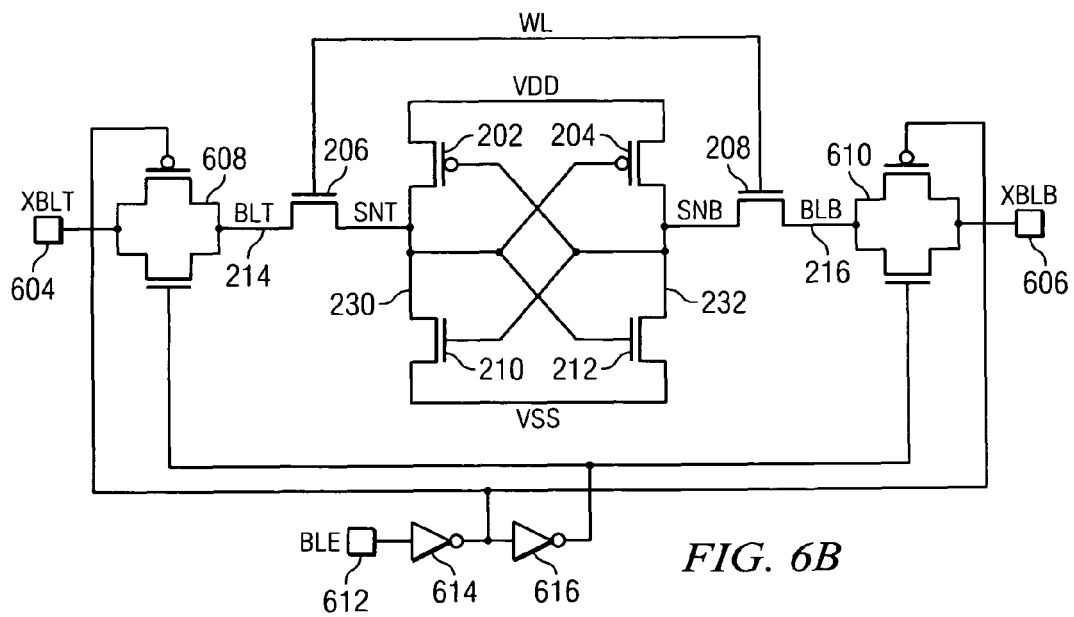
FIG. 6B is a second embodiment of a parametric test circuit of the present invention to improve the memory cell trip voltage (Vtrip) parametric test.

Referring now to FIG. 6B, there is a second embodiment of an improved parametric test circuit of the present invention. The circuit includes P-channel drive transistors 202 and 204 and N-channel drive transistors 210 and 212. The drive transistors are connected in a cross coupled manner as shown to form a latch. A first access transistor 206 has a current path connected between a true terminal (SNT) 230 of the latch and a first access terminal (BLT) 214 and has a first control terminal. The first access terminal 214 is connected to test pad 604. A second access transistor 208 has a current path connected between a complementary terminal (SNB) 232 of the latch and a second access terminal (BLB) 216 and has a second control terminal connected to the first control terminal. The second access terminal 216 is connected to test pad 606. A first pass gate 608 has a current path connected between the first access terminal 214 and a third access terminal (XBLT) 604 and has a third control terminal. A second pass gate 610 has a current path connected between the second access terminal 216 and a fourth access terminal (XBLB) 606 and has a fourth control terminal connected to the third control terminal. The third (XBLT) and fourth (XBLB) access terminals are arranged so that they may be independently controlled. Thus, one access terminal may be held high while the other access terminal is incrementally changed.

In operation, the circuit operates as previously described with respect to FIGS. 4 and 5 with the following exceptions. First, steps 406 and 410 (FIG. 4) are omitted. Second, enable signal (BLE) at test pad 612 goes low prior to each transition of VBLT (e.g. T1-T3). In response, inverters 614 and 616 produce control signals to turn off pass gates 608 and 610. The enable signal returns high after each overshoot (e.g. 500-504) has passed and the value of VBLT has settled to the intended value to turn on pass gates 608 and 610. Thus, both access transistors are isolated from the overshoot at VBLT (or VBLB) and, therefore, the overshoot does not affect the data state stored in the latch circuit of the memory cell.

Figure 7:
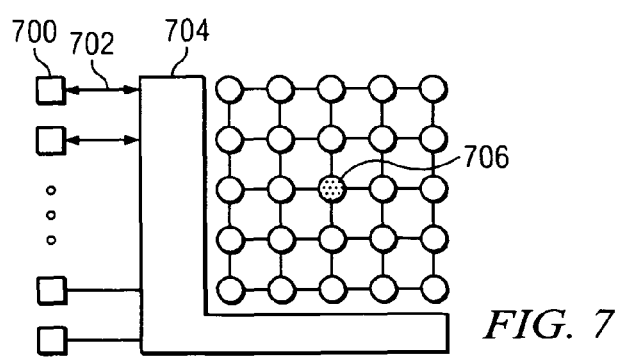
FIG. 7 is a block diagram of a test circuit having an array of memory cells and may include the test circuits of FIG. 6A or 6B.

Referring now to FIG. 7, there is a block diagram of a test circuit having an array of memory cells and may include the test circuits of FIG. 6A or 6B. The test circuit includes plural test pads such as test pad 700 connected to logic circuit 704 via leads 702. Leads 702 preferably include data, control, and power supply connections for operating the test circuit. Memory cells of the array are indicated by circles. Memory cells of test circuits previously described with reference to FIGS. 6A and 6B are preferably located in a central part array as indicated by memory cell 706. Memory cell 706 is advantageously surrounded by neighboring memory cells under nominal bias conditions to avoid edge effects that may influence the test.

Still further, while numerous examples have thus been provided, one skilled in the art should recognize that various modifications, substitutions, or alterations may be made to the described embodiments while still falling with the inventive scope as defined by the following claims. For example, in the previous discussion an abrupt drop in measured IBLB indicates a change of data state of the memory cell under test. An abrupt increase in measured IBLT may also be used to indicate the same change of data state. Other combinations will be readily apparent to one of ordinary skill in the art having access to the instant specification.

What is claimed is:

1. A test circuit, comprising:
   a latch circuit having true and complementary terminals, a first drive transistor having a current path connected to the true terminal plus a control terminal connected to the complementary terminal, and a second drive transistor having a current path connected to the complementary terminal plus a control terminal connected to the true terminal;
   a first access transistor having a current path connected between the true terminal and a first access terminal and having a first control terminal;
   a second access transistor having a current path connected between the complementary terminal and a second access terminal and having a second control terminal connected to the first control terminal;
   a first pass gate having a current path connected between the first access terminal and a third access terminal and having a third control terminal; and
   a second pass gate having a current path connected between the second access terminal and a fourth access terminal and having a fourth control terminal connected to the third control terminal.

2. A test circuit, as in claim 1, wherein the latch circuit and the first and second access transistors comprise a static random access memory cell.

3. A test circuit, as in claim 2, wherein the static random access memory cell is one of an array of memory cells.

4. A test circuit, as in claim 3, wherein the array of memory cells comprises a static random access memory circuit arranged to operate in a design for test mode.

5. A test circuit, as in claim 1, comprising an array of memory cells.

6. A test circuit, as in claim 1, wherein the third and fourth access terminals are arranged so that they may be independently controlled.

7. A test circuit, as in claim 1, wherein each of the third and fourth access terminals is coupled to a respective test pad.

8. A test circuit, comprising:
   a latch circuit having true and complementary terminals, a first drive transistor having a current path connected to the true terminal plus a control terminal connected to the complementary terminal, and a second drive transistor having a current path connected to the complementary terminal plus a control terminal connected to the true terminal;
   a first access transistor having a current path connected between the true terminal and a first access terminal and having a first control terminal;
   a second access transistor having a current path connected between the complementary terminal and a second access terminal and having a second control terminal connected to the first control terminal; and
   a logic circuit having an output terminal coupled to the first and second control terminals and having an input terminal coupled to receive an enable signal.

9. A test circuit, as in claim 8, wherein the latch circuit and the first and second access transistors comprise a static random access memory cell.

10. A test circuit, as in claim 9, wherein the static random access memory cell is one of an array of memory cells.

11. A test circuit, as in claim 10, wherein the array of memory cells comprises a static random access memory circuit arranged to operate in a design for test mode.

12. A test circuit, as in claim 8, comprising an array of memory cells.

13. A test circuit, as in claim 8, wherein the input terminal of the logic circuit is coupled to a test pad.

14. A test circuit, as in claim 13, wherein the logic circuit comprises an inverter.

15. A test circuit, as in claim 8, wherein each of the first and second access terminals is coupled to a respective test pad.

16. A test circuit, as in claim 8, comprising:
   a first pass gate having a current path connected between the first access terminal and a third access terminal and having a third control terminal; and
   a second pass gate having a current path connected between the second access terminal and a fourth access terminal and having a fourth control terminal connected to the third control terminal.

17. A test circuit, as in claim 16, wherein each of the third and fourth access terminals is coupled to a respective test pad.

18. A method of testing a memory cell having first and second data terminals, comprising the steps of:
   (a) writing a data state in the memory cell;
   (b) applying a next test voltage to the first data terminal;
   (c) applying a first voltage to the second data terminal;
   (d) applying a second voltage having a value greater than the first voltage to the second data terminal;
   (e) measuring a current through one of the first and second data terminals;
   (f) repeating steps (b) through (e) in response to a first value of the current; and (g) terminating the test in response to a second value of the current.

19. A method of testing as in claim 18, wherein the memory cell is a static random access memory cell.

20. A method of testing as in claim 18, wherein the step of applying a next test voltage comprises applying an incrementally lower voltage at each successive step (b).

21. A method of testing as in claim 18, wherein the step of applying a next test voltage comprises applying a selected test voltage different from a previous test voltage at each successive step (b) until step (e) measures the second value of the current.

22. A method of testing as in claim 18, wherein the step of applying a next test voltage comprises applying a plurality of test voltages and recording the current into the second data terminal at each respective test voltage.

23. A method of testing as in claim 18, comprising the step of increasing a word line voltage and restoring the word line voltage at the memory cell after step (c) and before step (d).

24. A method of testing as in claim 18, comprising the step of changing a supply voltage at the memory cell from a first voltage to a second voltage and back to the first voltage after step (c) and before step (d).

25. A method of testing as in claim 18, comprising testing a trip voltage of a memory cell.

26. A method of testing as in claim 18, wherein one of the first and second values of the current comprises a first range of values of current.

27. A method of testing as in claim 26, wherein another of the first and second values of the current comprises a second range of values of current different from the first range of values of current.

\* \* \* \* \*